United States Patent [19]

Miller et al.

[11] Patent Number: 4,476,560
[45] Date of Patent: Oct. 9, 1984

[54] DIAGNOSTIC CIRCUIT FOR DIGITAL SYSTEMS

[75] Inventors: Warren K. Miller, Hayward; Michael J. Miller, San Jose; John M. Birkner, Sunnyvale, all of Calif.

[73] Assignees: Advanced Micro Devices, Inc., Sunnyvale, Calif.; Monolithic Memories, Inc.

[21] Appl. No.: 420,679

[22] Filed: Sep. 21, 1982

[51] Int. Cl.³ .............................................. G06F 11/00
[52] U.S. Cl. .............................................. 371/15
[58] Field of Search ......................... 371/25, 22, 15; 324/73 R; 364/900

[56] References Cited

U.S. PATENT DOCUMENTS

| | | | |
|---|---|---|---|
| 3,657,699 | 4/1972 | Rocher et al. | 371/2 |
| 3,761,695 | 9/1973 | Eichelberger | 371/25 |
| 4,042,794 | 8/1977 | Lima et al. | 371/22 |
| 4,241,307 | 12/1980 | Hong | 324/73 R |
| 4,244,048 | 1/1981 | Tsui | 371/25 |
| 4,317,200 | 2/1982 | Wakatsuki et al. | 371/25 |

Primary Examiner—Charles E. Atkinson
Attorney, Agent, or Firm—Patrick T. King; Gary T. Aka

[57] ABSTRACT

An improved circuit for serial scan diagnosis is provided. A state register in the signal path of the digital system under diagnosis is coupled to a diagnostic shift register. Test data is introduced and removed through the diagnostic shift register through a serial input terminal and serial output terminal. For certain operations the serial input terminal becomes a control terminal whereby a minimum number of control lines is required.

18 Claims, 8 Drawing Figures

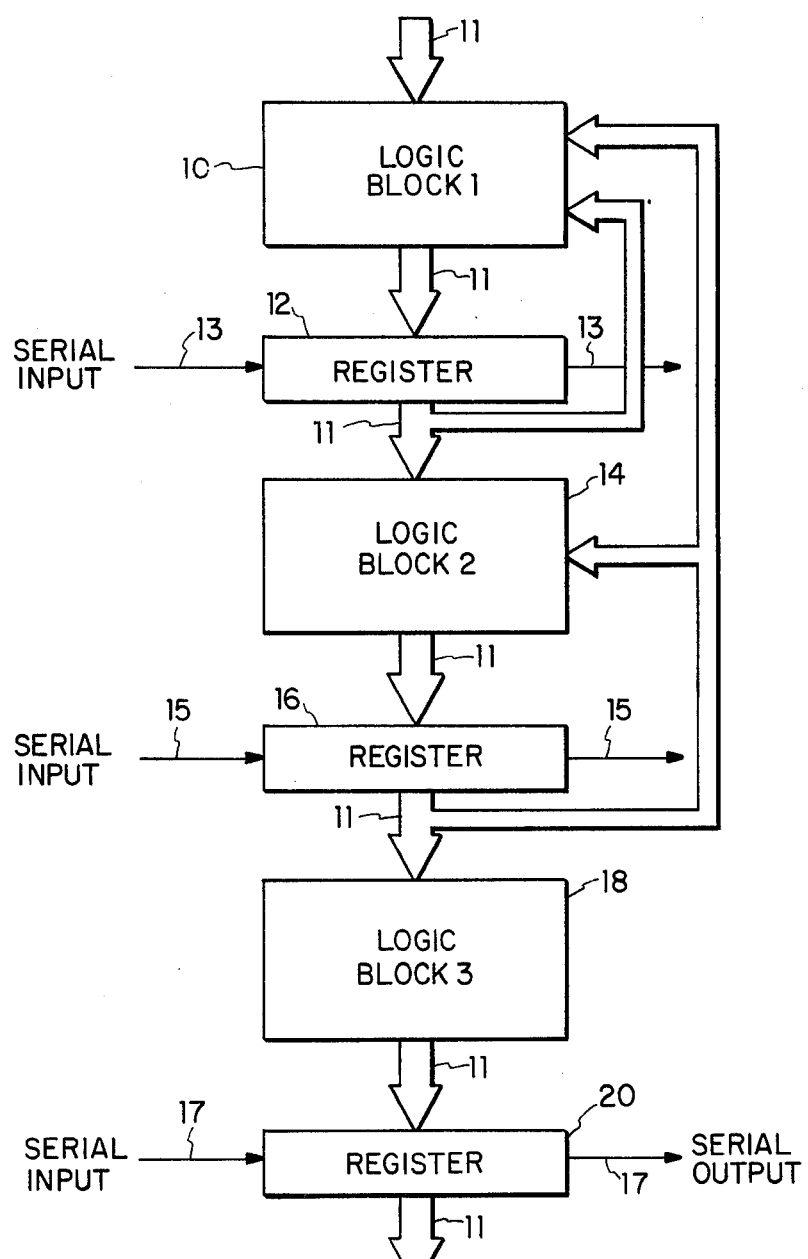
GENERALIZED DIGITAL SYSTEM WITH
PRIOR ART SERIAL SCAN
FIG.—1

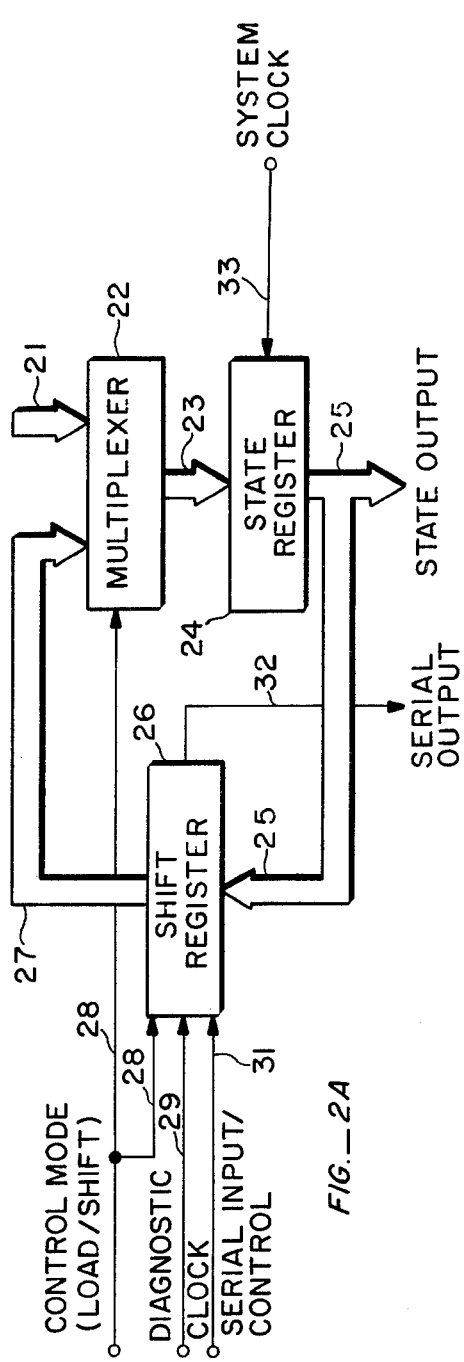

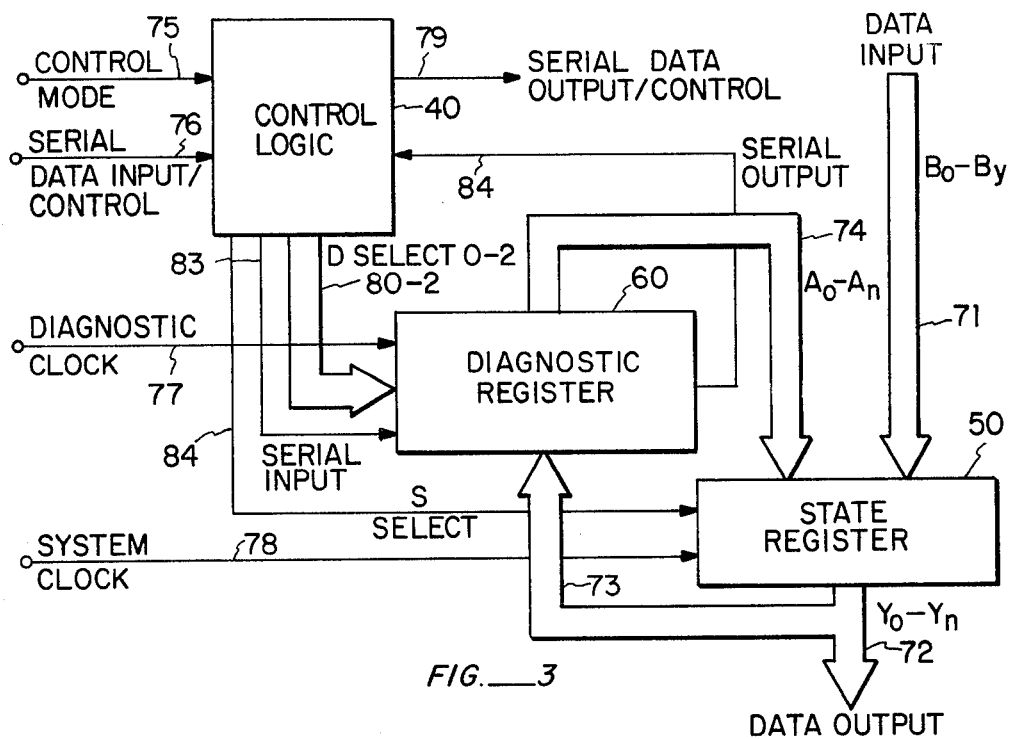
FIG._3
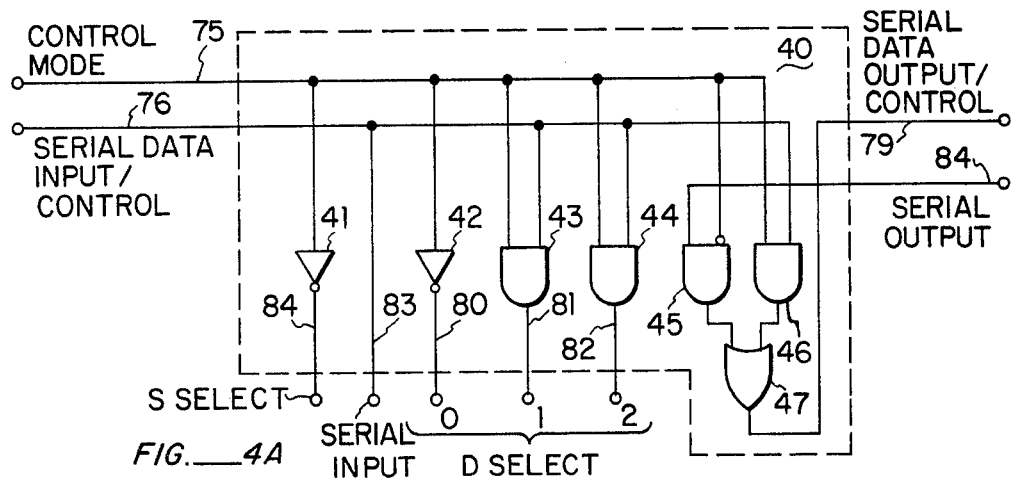
FIG._4A
| SERIAL DATA INPUT/CONTROL | CONTROL MODE | S SELECT | D SELECT 0 | D SELECT 1 | D SELECT 2 |
|---|---|---|---|---|---|
| L | H | L | L | H | L |
| H | H | L | L | L | H |
| L | L | H | H | L | L |
| H | L | H | H | L | L |
FIG._4B

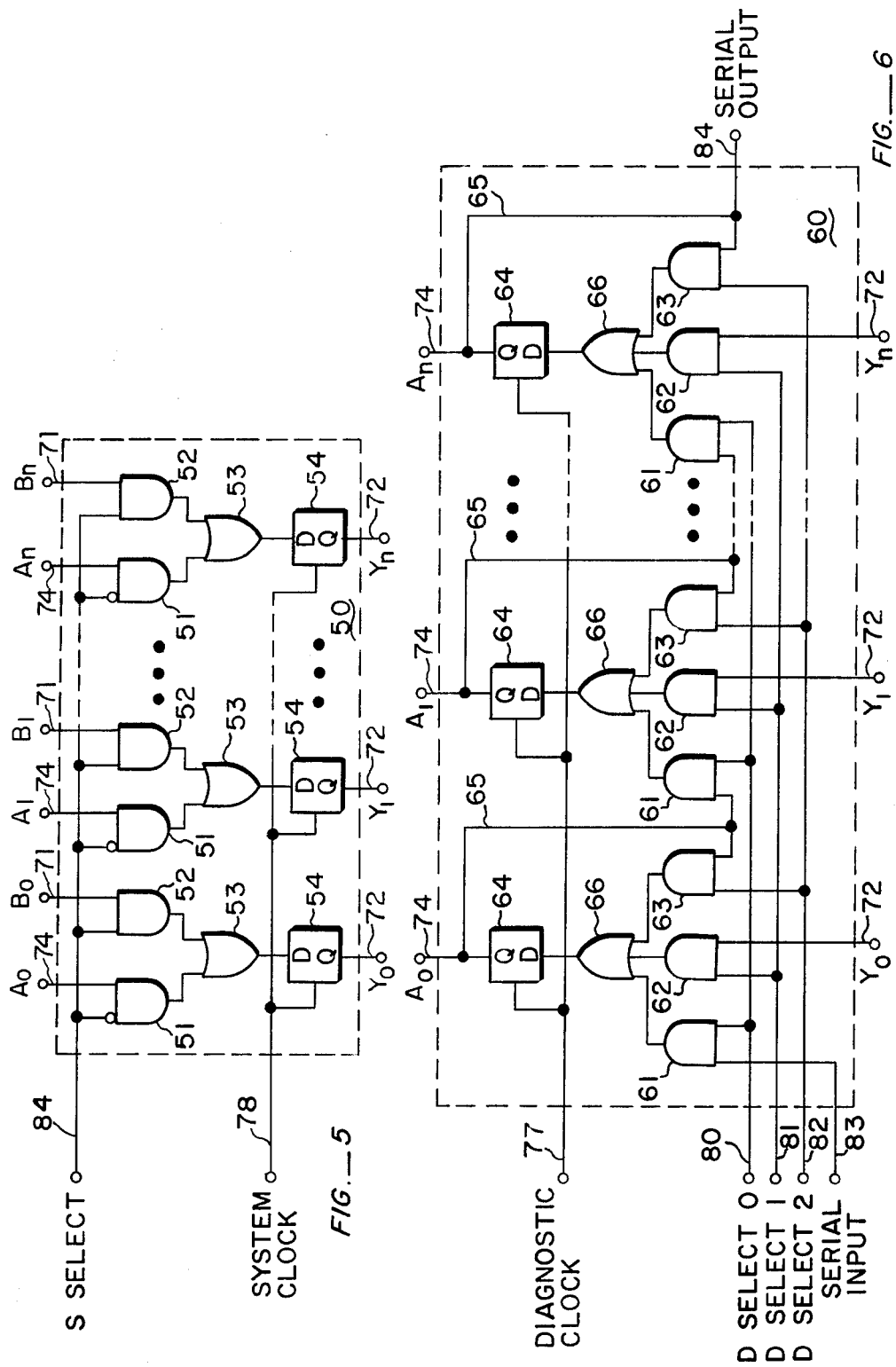

DIAGNOSTIC CIRCUIT FOR DIGITAL SYSTEMS

BACKGROUND OF THE INVENTION

1. Field of the Invention

This invention relates to electrical circuits useful in diagnosing faults in digital systems, and more particularly, for diagnosing faults by serial scan techniques.

2. Prior Art

A digital system may often be generalized into a system of logic blocks. The logic blocks, which may consist of a large number of logic gates performing complicated functions, operate on sets of parallel data and control signals. The signals enter a particular logic block, are transformed, and leave the logic block for the next logic block. The data travel through the logic blocks of the system until they exist as the desired output data of the system.

Signal paths for the electrical control and data signals connect the logic blocks. Registers are usually located in these signal paths to temporarily hold the digital signals from one logic block and to release the data to the next logic block at the proper time. The data may also be released as feedback to logic blocks "upstream". Registers permit the proper coordination of data movement through the system.

In these systems the testing and diagnosing of faults becomes a problem. If a failure occurs at some point within the system and only the input and output ports of the system are available for testing, then the isolation of the failure becomes very difficult. For example, any test input data must pass through logic blocks 1 and 2 before the data can be used to test the logic in block 3. Any failure in these earlier logic blocks cause the data to be unusable for testing later logic blocks. Even if logic "upstream" from the failure functions correctly, the test output data may be ruined by an intervening failure. The fault with this type of system organization is that hardware failures may be detected but not located.

Isolation of faults is possible if intermediate test points are available and various designs have been proposed. One technique which is used to provide these intermediate test points is the serial scan technique. A generalized digital system, as discussed previously, is shown in FIG. 1. The system is modified so that serial scan diagnosis is possible. As in a generalized system, the data and control signals move from logic block to logic block along signal path 11. Shift registers 12, 16, 20 maintain the timing of signal movement. However, the registers are modified so that they can operate in two modes. In the normal mode the registers pass signals in parallel from one logic block to another. In the diagnostic mode the registers operate as serial shift registers by which test data may be shifted into the register. Then the registers in normal mode release the test data into the logic blocks to be operated upon. The test data is then read out by the registers receiving the test output data for examination of faults. For example, logic block 2 in FIG. 1 may be examined by the serial introduction of test data into the register 12, passing the data through logic block 2 and serially removing the test data by the register 16.

A variation of the serial scan technique has the serial output line connected to the serial input line of a succeeding register. A string of test data is scanned into the registers, which are then set to operate in normal mode. After the logic blocks operate on the test data from the registers, the test data is scanned out in a string to determine whether faults exist in the different logic blocks. Other variations of the serial scan technique are possible. All of these variations reduce the number of test-fix iterations necessary to repair or debug a system for a corresponding reduction in cost.

However, the simple serial scan register circuit of FIG. 1 has problems, one of which may occur when the register is in the control path of the system, such as a microinstruction register of a processor. In such a register, certain data combinations at certain bit positions may be forbidden. This forbidden conditions may be violated as the data information is scanned in or out of the serial shift register.

For example, a typical field in a microinstruction register could include a series of enable bits to enable buffers onto a bus. If serial test data is shifted through this microinstruction register, a condition could result which is illegal in normal execution (a restriction is put on the control flow such that only one bit can be low, or enabled, at a time). This illegal combination results in overstressing the devices and could seriously damage the associated circuitry.

Other problems result in latched systems and asynchronous systems. In an asynchronous system, if one of the outputs, or a logical combinations of outputs, of the shift register is used to generate a signal to an asynchronous (unclocked) subsystem, such as a memory or input/output device, an unwanted access to the subsystem may be generated when the register is shifted for test operations. This could result in an unpredictable disruption of the system state, making fault isolation much more difficult.

In a latched system, the register used as a microinstruction register and having its bit outputs, or logical combinations thereof, setting, resetting or opening latches in the system causes problems also. Test data shifted through the register may disturb the system state. This type of problem is especially serious when the latch contents cannot be re-established, making additional testing virtually impossible.

The present invention solves or substantially mitigates these problems and is a substantial advancement over the simple serial scan register. A circuit is provided by which data may be serially introduced into and removed from a signal path for the testing of the integrity of the digital system. The circuit has a minimum number of control lines to achieve a savings in economy, yet retains ample control functions for flexibility.

SUMMARY OF THE INVENTION

The present invention provides for a circuit for a digital signal path comprising control means; first means connected in the signal path and responsive to the control means for selectively holding the signals of the path; and second means connected to the first means and responsive to the control means for selectively holding signals from the first means and releasing signals to the first means, the second means having input-output means for selectively accepting digital signals for selectively sending digital signals, whereby digital signals may be inserted into the signal path and removed from the signal path through the input-output means.

The present invention also provides for a circuit for the selective introduction and removal of digital signals into and from a digital signal path comprising a multiplexer, a first signal storage means connected to the multiplexer for holding digital signals from the multiplexer, a second signal storage means connected to the multiplexer and first signal storage means for selectively holding digital signals from the first signal storage means and for providing digital signals to the multiplexer, the multiplexer controllably selecting signals from the digital signal path and from the second signal storage means, the shift register further connected to serial input-output terminal means for the selective introduction and removal of digital signals.

The circuit is further designed so that the controllable selection of the digital signals by the multiplexer and the selection of holding and providing digital signals or introduction and removal of digital signals by said second signal storage means is by means of a control signal on a single control line. Furthermore, the input-output terminal means may be first and second terminals wherein the first terminal is selectively an input terminal or a control terminal responsive to control signals on the control line.

BRIEF DESCRIPTION OF THE DRAWINGS

A further understanding of the present invention may be attained by a perusal of the following Detailed Description in the specification and by reference to the following drawings:

FIG. 1 illustrates a generalized digital system having prior art serial scan registers for diagnosing errors in the system.

FIG. 2A is an illustration of the architecture of the present invention; FIG. 2B is a table of functional states for the system shown in FIG. 2A.

FIG. 3 is an illustration of the architecture of a specific embodiment of the present invention.

FIG. 4A illustrates in detail the control logic block used in FIG. 3; FIG. 4B is a table of states for the control logic block illustrated in FIG. 4A.

FIG. 5 is a detailed illustration of the state register block found in FIG. 3.

FIG. 6 is a detailed illustration of the diagnostic register block shown in FIG. 3.

DETAILED DESCRIPTION

The present invention has two registers, one is a state register which holds the signals of the data signal path in a digital system and the other is a diagnostic register which may be connected to external test equipment for loading and unloading test data. The two registers are coupled together so that a minimum number of control lines are used for the proper coordination of the two registers. The signal contents may be transferred from one register to the other, and in the opposite direction. Furthermore, the signals may be serially introduced into and removed out of the diagnostic register. These functions are achieved with one full time control line, two clock lines, and two serial input and output lines.

The provision of a state register and a diagnostic register prevents the problems associated with the simple serial scan register. Of course, the present invention is not restricted to registers. Other forms of signal storage circuits may be used, such as latches.

FIG. 2A illustrates the present invention. A register 24 temporarily holds the digital signals on the signal path 11 between logic blocks shown in FIG. 1. The digital signal path 21 is illustrated by an arrow as input signals. The present invention provides for a separate shift register 26 which can hold the contents of the state register 24 by loading its contents in parallel as shown by a branch of the signal path 25. The contents of the shift register 26 may be reloaded back into the state register 24 along the path 27. A multiplexer 22 by the control signals on the control mode line 28 selects whether the signals of the path 21 or of the path 27 are selected.

The shift register 26 can also load signal information serially through a serial input line 31 and can unload information serially by a serial output line 32. Both registers are controlled by clocks, the state register 24 by a system clock through a line 33 and the shift register 26 by a diagnostic clock through a line 29. Both registers 24 and 26 operate on the rising edge of the clock pulse signals.

FIG. 2B illustrates the functional operation of the circuit shown in FIG. 2A. When the control mode signal on line 28 is "low", the circuit is in a "shift" mode so that with a rising clock pulse from the diagnostic clock on the line 29, the diagnostic register 26 accepts signal data along line 31 and shifts out its content along line 32 one rising clock pulse at a time. Thus the serial input in the table of FIG. 2B is shown as "I" as input and the serial output is shown as "O" as output. This is operation number 1. With the control mode still "low" and with the rising clock pulse of the system clock, the state register 24 loads the data signals of the system as indicated by the data path 21 and 23. The multiplexer 22 with the control mode signal "L", or low, selects the signals of path 21.

When the control mode signal goes high, the "load" mode, the serial input line 31 becomes a control line. In operation 2 the serial input line is low and the shift register 26 is loaded in parallel with the contents of the state register 24 along the data path 25 upon a rising clock signal from the diagnostic clock. With the same control signals and a rising system clock signal, operation number 5 occurs. The state register 24 is loaded with data contents of the diagnostic register 26 via the data path 27. The multiplexer 22 selects the path 27.

It should be noted that FIG. 2B indicates the timing of a particular operation by an upward pointing arrow, the rising pulse of clock signal. The other clock is always indicated as " ". This indicates that the other clock has a stable signal, during the rising pulse of the first clock so as to keep the timing of the circuit clear and orderly. Operations number 3 and 6 in which the control mode signal is "H", or high, and the serial input line 31 is also high, are optional operations and are indicated as such. For example, in the embodiment shown in FIG. 3, operation 6 is specifically selected to be a "hold" operation by which no operation occurs. Despite the limited number of control lines, the circuit has more than sufficient control states for the circuit to perform its function to permit introduction and removal of data in digital signal paths.

Another feature of the circuit is that the serial output signal on the line 32 follows the signal of the serial input on line 31 when that line is being used as a control line. When the line 32 signal is high or low, the line 31 signal is high or low respectively. This is a useful feature. In many cases it is useful to connect several of these diagnostic circuits so that the serial output line 32 is connected to a serial input line 31 of another diagnostic circuit which has its own serial output line 32 connected to the input line 31 of a third diagnostic circuit and so forth. This permits diagnostic data to be cycled into and out of the various diagnostic shift registers 26, as discussed previously. When the control mode signal is high to all of these circuits, input line 31 of the first diagnostic circuit controls all of the other diagnostic circuits.

One detailed embodiment of the present invention is shown in FIG. 3 and the individual component blocks are illustrated in FIGS. 4A, 5 and 6. In FIG. 3 the state register 50 includes the multiplexer shown in FIG. 2A. The state register 50 thus can accept the signals of the path 71 representing the data path of the digital system. The diagnostic register 60 receives the contents of the state register along the path 73 and in turn may load the state register 50 along the path 74. As shown in FIG. 3 these parallel data paths are n+1 signal lines wide with the incoming system signals designated as $B_0$-$B_N$, the output signals to the next logic block in the digital system designated as $Y_0$-$Y_N$ and the signals from the diagnostic register 60 back into the state register designated as $A_0$-$A_N$. This circuit functions in the same manner as discussed previously. The control logic block 40 generates the internal control signals for performing all of the required functions available of the circuit.

The control logic block 40 is illustrated in detail in FIG. 4A. Control signals through input terminals for the control mode line 75 and the serial data input/control line 76 generate control signals for the S Select line 84, the serial input line 83, and the D Select lines 80-82. Furthermore the block 40 receives the serial output signal from the diagnostic register block 60 along the line 84.

FIG. 4B is a table of generated control signals for S select and D select 0-2 generated by the control block 40. It should be noted from the table that only one of the D Select lines is "H" or high at a time. D Select 0 high indicates that the "shift" mode has been selected. D Select 1 high corresponds to the "load" mode and D Select 2 high to a "hold" mode in which nothing changes. The serial input signal on line 83 is not included since it is the same as signal D select 0, the complement of the control mode signal. Thus the inverters 41, 42 and AND gates 43, 44 generate the control signals for the diagnostic register block 60 and the state register block 50.

Responsive to control signals, the logic block 40 also selects whether the serial output signal or the signal on the line 76 is to be sent on line 79. When the line 75 is low so that the diagnostic circuit is in a "shift" mode, the AND gate 45 allows the signal on line 84 to enter the OR gate 47 to appear as an output signal on the serial data output line 79. When the control mode signal is high the AND gate 45 no longer passes signals on the line 84, instead, by the AND gate 46, signals on the line 76 are selected for the OR gate to the serial data output line 79. In this fashion, when the line 76 is used as a control line, the line 76 input terminal signal passes through the line 79 output terminal.

A detailed illustration of the state register block 50 is shown in FIG. 5. The block 50 has multiplexing functions performed by the AND gates 51 and 52 and the OR gates 53. A low signal on the S select line 84, representing a high signal for the control mode, enables the AND gates 51 so that the signals $A_0$-$A_N$ are selected. A high signal on the line 84 corresponding to a low signal for the control mode, selects signals $B_0$-$B_N$ through the data path input terminals. The selected signals through the OR gate 53 enter the D flip flops 54. These D flip flops 54 are triggered by a positive rising clock pulse from the clock for the system through an input terminal of the line 78, the system clock line, and the signal is then registered. These registered values appear on the data output path 72 to the data path output terminals as values $Y_0$-$Y_N$.

FIG. 6 is a detailed illustration of the diagnostic register block 60 which receives input signals along a diagnostic clock line 77, D select lines 80-82, and a serial input line 83. As explained previously only one of the D select lines can be high at one time. When D select line 80 is high, corresponding to the "shift" mode, the AND gate 61 selects the serial input signal on the line 83, for the D flip flop 64 through the OR gate 66. This is true for the logic gates and flip flop for the 0th bit place. The gates and flip flops for bit places 1 to n select by the AND gates 61 the output signals of the preceding flip flops 64 on a feedback lines 65. A shift occurs when the rising edge of the diagnostic clock pulse occurs on the line 77. The signal $A_n$ registered by the last flip flop 64 appears on the serial output line 84. With the rising clock pulse from a clock for the diagnostic circuit through an input terminal of the line 77 the flip flop 60 registers that value. A high signal on the D select 1 line 81, selects the values $Y_0$-$Y_N$ of the data path 72 as input signals to be latched by D flip flop 64. A high signal on the line 82 merely holds the value in the flip flop 64 since the AND gate 63 are enabled and the signals in the flip flops 64 are fed back along the feedback lines 65.

Accordingly, while the invention has been particularly shown and described with reference to the preferred embodiments, it would be understood by those skilled in the art that changes in form and details may be made therein without departing from the spirit of the invention. It is therefore intended that an exclusive right be granted to the invention as limited only by the metes and bounds of the appended claims.

What is claimed is:

1. A circuit for the selective introduction and removal of digital signals into and from a digital signal path comprising
    control means,
    first means connected in said signal path and responsive to said control means, for selectively holding signals of said path,
    second means connected by a first input-output means to said first means and responsive to said control means for selectively holding signals from said first means and releasing signals to said first means, said second means having a second input-output means for selectively accepting digital signals and for selectively sending digital signals,
    whereby digital signals may be inserted into said signal path and removed from said signal path through said second input-output means.

2. A circuit as in claim 1 wherein said first means is connected to said second means in such a manner that signals are transferred in parallel by said first input-output means between first means and second means and wherein signals are transferred serially through said second input-output means.

3. A circuit as in claim 2 wherein said control means comprises a first control terminal by which control signals determine the selected operations for said first means and said second means.

4. A circuit as in claim 3 wherein said second input-output means comprises an input terminal and an output terminal, said input terminal becoming a second control terminal by a predetermined control signal through said first control terminal, whereby the number of said circuit operations may be increased.

5. A circuit as in claim 4 wherein by said predetermined control signal, said output terminal is coupled to said input terminal in such a manner that signals from said output terminal correspond to signals to said input terminal.

6. A circuit for the selective introduction and removal of digital signals into and from a digital signal path comprising
multiplexer means,
first signal storage means connected to said multiplexer means for holding digital signals from said multiplexer,
second signal storage means connected to said multiplexer means and said first signal storage means for selectively holding digital signals from said first register means and for providing digital signals to said multiplexer means, said muiltiplexer means controllably selecting signals from said digital signal path and from said second signal storage means, said second signal storage means further connected to serial input-output terminal means for the selective introduction and removal of digital signals.

7. A circuit as in claim 6 wherein the controllable selection of digital signals by said multiplexer means, the selection of holding and providing digital signals or introduction and removal of digital signals by said second signal storage means is by means of a control signal on a single control line, said single control line being coupled to said multiplexer means and further being coupled to said second signal storage means.

8. A circuit as in claim 7 wherein said serial input-output terminal means comprises an input terminal and an output terminal, said input terminal selectively an input terminal or a control terminal, responsive to control signals on said control line.

9. A circuit as in claim 8 wherein, when said input terminal is selectively a control terminal, said output terminal is coupled to said input terminal in such a manner that signals from said output terminal correspond to signals to said input terminal.

10. A circuit as in claim 9 wherein said first signal storage means comprises a first register and said second signal storage means comprises a shift register.

11. A circuit as in claim 10 wherein said first register is responsive to a first timing means and said shift register is responsive to a second timing means.

12. A circuit for the introduction and removal of digital signals into and from a digital signal path having
a first signal storage means, said first signal storage means having a plurality of input terminals for accepting said path signals, and
a plurality of output terminals on said first storage means for sending said path signals;
said circuit also having a second signal storage means, said second signal storage means having a serial input terminal for signals to be introduced into said signal path, and
a serial output terminal for signals to be removed from said path; and
said circuit also having a first control terminal responsive to a first signal for the movement of signals into said serial input terminal and from said serial output terminal, and to a second signal by which said serial input terminal becomes a second control terminal.

13. A circuit as in claim 12 wherein responsive to said second signal, said serial output terminal is coupled through said second signal storage means to said serial input terminal so that signals through said serial output terminal correspond to signals through said serial input terminal.

14. A circuit for the introduction and removal of signals into and from a digital signal path comprising:
first signal storage means coupled to said digital signal path,
second signal storage means coupled to said first signal storage means,
control logic means, having a control mode terminal, a first serial input terminal, a first serial output terminal, a second serial input terminal, a second serial output terminal, and coupled to said first and second signal storage means, whereby a first signal on said control mode terminal permits the introduction and removal of signals through said first serial input and output terminals, and the transfer of signal path signals to said first signal storage means.

15. A circuit as in claim 14 wherein by a second signal on said control mode terminal, said first serial input terminal operates as a control terminal, and a first signal on said first serial input terminal permits signals to be transferred in parallel between said first and second signal storage means.

16. A circuit in claim 15 wherein, when said first serial input terminal operates as a control terminal, said first serial output terminal is coupled to said first serial input terminal so that said first serial output terminal signals correspond to said first serial input terminal signals.

17. A circuit as in claim 16 comprising a first clock terminal coupled to said first signal storage means so that signals are transferred from said second signal storage means to said first signal storage means, upon a first clock signal and a second clock terminal coupled to said second signal storage means so that signals are transferred from said first signal storage means to said second signal storage means upon a second clock signal.

18. A circuit as in claim 17 wherein said first signal storage means comprises a register and said second signal storage means comprises a shift register.

* * * * *